United States Patent [19]

Hoeberechts et al.

[11] 3,916,509

[45] Nov. 4, 1975

[54] METHOD OF MANUFACTURING A SEMI-CONDUCTOR TARGET FOR A CAMERA TUBE HAVING A MOSAIC OF P-N JUNCTIONS COVERED BY A PERFORATED CONDUCTIVE LAYER

[75] Inventors: Arthur Marie Eugene Hoeberechts; Else Kooi, both of Emmasingel, Eindhoven, Netherlands

[73] Assignee: U.S. Philips Corporation, New York, N.Y.

[22] Filed: Jan. 30, 1975

[21] Appl. No.: 545,620

Related U.S. Application Data

[60] Continuation of Ser. No. 345,133, March 26, 1973, abandoned, which is a division of Ser. No. 140,734, May 6, 1971, Pat. No. 3,737,701.

[30] Foreign Application Priority Data

May 16, 1970 Netherlands ........................ 7007171

[52] U.S. Cl. .................... 29/578; 29/580; 148/188; 357/56

[51] Int. Cl.$^2$ .......................................... B01J 17/00

[58] Field of Search ............ 29/572, 578, 580, 579; 148/187, 188; 357/56; 313/367

[56] References Cited

UNITED STATES PATENTS

| | | | |
|---|---|---|---|
| 3,275,910 | 9/1966 | Phillips | 29/578 X |
| 3,385,729 | 5/1968 | Larchian | 29/576 X |
| 3,491,434 | 1/1970 | Cunningham et al. | 29/571 X |
| 3,532,539 | 10/1970 | Tokuyama et al. | 357/56 X |
| 3,564,309 | 2/1971 | Hoeberechts et al. | 313/367 |

*Primary Examiner*—Roy Lake
*Assistant Examiner*—James W. Davie
*Attorney, Agent, or Firm*—Frank R. Trifari; Carl P. Steinhauser

[57] ABSTRACT

A camera employing a semi-conductor target positioned to be scanned by an electron beam. The target comprises a wafer of semi-conductive material of a particular conductivity type, e.g. n-type silicon. A plurality of islands separated by grooves project from the wafer on the side exposed to the electron beam. These islands are of opposite conductivity and form with the wafer rectifying junctions. On the exposed surface of each island is a metal layer which is separated from the semi-conductive material of the island by an insulating layer having an aperture therein.

5 Claims, 9 Drawing Figures

Figure 1:
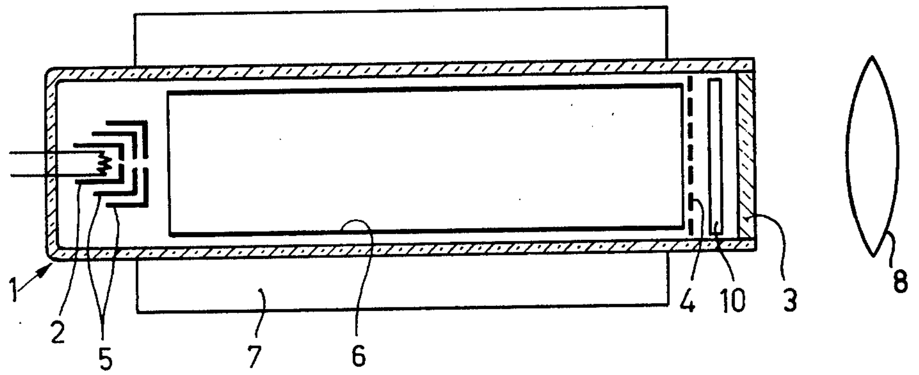

METHOD OF MANUFACTURING A SEMI-CONDUCTOR TARGET FOR A CAMERA TUBE HAVING A MOSAIC OF P-N JUNCTIONS COVERED BY A PERFORATED CONDUCTIVE LAYER

This is a continuation of U.S. application Ser. No. 345,133 filed Mar. 26, 1973, now abandoned, which is a division of Ser. No. 140,734, filed May 6, 1971, now U.S. Pat. No. 3,737,701.

The invention relates to a radiation-electric translator, in particular a camera tube, having an electron source and a radiation-sensitive target which is to be scanned by an electron beam emerging from said source and is constituted by a semiconductor plate which on the side to be scanned by the electron beam, comprises a mosaic of mutually separated regions which each constitute a rectifying junction with the part of a first conductivity type of the semiconductor plate adjoining said regions, termed the substrate, each of the mutually separated regions comprising an electrically conductive layer which bears on an insulating layer which comprises a window. The invention furthermore relates to a target of the above-described type which is suitable for application in such a radiation-electric translator, and furthermore relates to a method of manufacturing such a target. A radiation-electric translator and a target of the above-mentioned type are described, for example, in "The Bell System Technical Journal" 48 (1969 - May - June, pp. 1481–1528), in particular as far as the target is concerned, pp 1501–1503, and in addition in the U.S. Pat. No. 3,403,284. The semiconductor plate consists of monocrystalline silicon and the semiconductor material comprises on the scanning side a flat surface which is covered with a coherent insulating layer which is provided with a mosaic of apertures. The semiconductor plate consists of a coherent region of n-type silicon and a mosaic of p-type regions on the scanning side, which emerge at the surface at the area of the apertures in the insulating layer. A mosaic of juxtaposed electrically conductive layers bears on the insulating layer and contacts the regions of the p-type through the windows in said layer. The juxtaposed conductive layers on the insulating layer are separated from each other by a comparatively narrow gap. The bottom of said separation gap is formed by the insulating layer, as a result of which the underlying n-type semiconductor material is screened from incident electrons of the scanning electron beam.

In this construction the danger exists that the insulating surface in the gap is charged by the scanning electron beam. Such a charge may have a repellent effect on the electrons of the scanning electron beam such that the adjacent regions of the mosaic are insufficiently charged. Furthermore the danger exists that as a result of said static charge on the insulating layer as well as by the voltage of the conductive layers, an inversion layer is formed below the oxide and causes a short-circuit connection between the p-type regions.

It has been purposed in the above-mentioned U.S. Pat. No. 3,403,284 to provide a conductive pattern in the gap on the insulating layer via which any static charge can be removed. However, for such a conductive pattern the gaps between the metal layers should be widened which is at the expense of the area of the surface to be scanned and consequently of the efficiency of the re-charging upon scanning by the electron beam. Furthermore the pattern of the conductors is more complicated and accurate masking methods for providing them are required.

It is to be noted that, according to the above-mentioned U.S. Pat. No. 3,403,284, instead of providing p-conductive regions on the scanning side in the semiconductor material, a metal may also be provided in the apertures on the n-type material, which metal forms a rectifying junction of the Schottky type with the said n-type material. In this case also the drawbacks as already described above hold good when using conductive contact layers on a mosaic of p-type regions, according to the above-described known structures.

One of the objects of the present invention is to provide a device having a target of the type described in the preamble, in which the above-described drawbacks are at least partly mitigated. According to the invention, longitudinal hollow spaces are present on the scanning side between the regions of the mosaic, both the conductive layers and the underlying parts of the insulating layer projecting laterally above the hollow spaces. The hollow spaces may be formed by grooves in the semiconductor material. The insulating layer in question which supports the conductive layer, will in practice also be interrupted so as to be able to form the relevant hollow spaces. These hollow spaces can be provided in a usual manner by etching, the insulating layer serving as a mask, and etching being carried out via gaps present in said layer. By underetching, the resulting grooves in the semiconductor material will be wider than the gaps in the oxide layer. The gap width can be made sufficiently narrow, for example narrower than 5 $\mu$, for example at most 3 $\mu$, with a detph of the hollow space of at least 1 $\mu$, preferably at least 2 $\mu$, in order that during scanning the number of electrons which comes in the hollow space through the gap between the conductive layers be comparatively small. Since the insulating layer also extends partly above the hollow space, the possibility of a shortcircuit between the conductive layer and the substrate material via the wall of the hollow space is reduced.

Although the conductive layers projecting above the hollow space prevent the penetration of electrons of the scanning electron beam into the hollow space, said electrons, when reaching the substrate material via the hollow space, can give a stray current with considerable noise which can confuse the picture signal. Therefore, an insulating coating is preferably applied on the substrate surface, at least on the bottom of the hollow space which insulating coating preferably also covers the walls of the hollow space. In order to prevent a considerable accumulation of negative charge on the walls of the hollow spaces, a conductive coating is preferably applied on the bottom of the hollow space. Those electrons which may penetrate into the hollow space via the said conductive coating can be removed to a connection which is brought at a suitable potential. Said conductive coating forms, as it were, a conductive grid in the network of longitudinal hollow spaces. This grid can be provided in a suitable manner simultaneously with the conductive layers associated with the mosaic of mutually separated regions or at least simultaneously with a part of the material of said conductive layers. This provision can be carried out by vapour-deposition in a vacuum while using the gap in the insulating layer hanging over the hollow space. The use of a more complicated photographic pattern and a reduction of the area occupied by the mosaic of conductive layers associated with the mosaic of regions becomes superfluous. Due to the presence of the insulating support below the metal layers projecting above the hollow space, the possibility of shortcircuit between said metal layers and the metal of the grid in the hollow spaces is kept small.

The barrier layers which the regions of the mosaic make with the semiconductor substrate may be of the Schottky type in which, at least in the window, a metal is provided which forms a junction of the Schottky type with the underlying semiconductor material. Preferably a rectifying junction of the p–n type is used which is obtained in particular by in-diffusion of an impurity which varies the conductivity type of the semiconductor material. For example, prior to or after providing the hollow spaces, a mosaic of semiconductor regions having a conductivity type opposite to that of the substrate material may be formed in the semiconductor material between the hollow spaces according to planar methods known as such. The p-n junctions may emerge at the semiconductor surface beyond the hollow spaces there where said semiconductor surface is coated by the insulating layer. For the insulating layer may be used in known manner a material which reduces surface recombination and hence the occurrence of a considerable leakage. Since in the construction according to the invention the hollow spaces extend also below the insulation, the contact surface between the substrate material and the insulating layer below the conductive layers of the mosaic is reduced and hence the possibility of the occurrence of undesirable short-circuit paths through pores in the insulating layer, so-called "pin holes", between the conductive layer and the substrate material, is redured. The above-described detrimental effect of such "pin holes" is avoided entirely, when according to the preferred embodiment a p-n junction of the so-called mesatype is used. In this case the p-n junction extends up to the walls of the surrounding hollow spaces, provided as grooves in the semiconductor plate. At that area said p-n junction is preferably coated again with an insulator which reduces the surface recombination. A p-n junction of said mesa type can be obtained by in-diffusing, prior to providing the grooves, an impurity throughout the surface of the relevant side of the semiconductor plate, which impurity forms a continuous zone of a conductivity type opposite to that of the substrate material. The grooves to be provided afterwards should then be deeper than the thickness of the said zone so that said zone is divided into a mosaic of mutually separated parts.

The semiconductor material of the plate preferably consists of silicon. As already said, an insulation which provides a reduced surface recombination is preferably used there where a p-n junction emerges at the surface. For that purpose is to be considered in particular silicon oxide or other materials containing silicon oxides and of which the stabilizing action is known per se. The insulation may also consist of more than one layer, for example, silicon oxide and silicon borate-, silicon phosphate-, or lead-silicate glasses. Combinations with aluminum oxide are also to be considered. Furthermore, the use of silicon nitride, in particular with underlying oxide, is possible.

In general these materials are to be considered for a possible insulating coating in the hollow space and/or for the insulating layers which support the mosaic of conductive layers.

In particular when silicon is used as a semiconductor material, an insulation coating can be formed in the hollow space by oxidation of the silicon of the wall of the space. The insulating material which projects partly above the hollow space should preferably be resistant to oxidation. In this respect the above-mentioned materials are to be considered. Moreover, it is desirable, after providing such an oxide in the hollow spaces, to provide the windows in the insulating layer on the semiconductor material between the hollow spaces without the oxide in the spaces being attacked. For that purpose silicon nitride is preferably used which is both resistant to oxidation and can be etched selectively.

The invention also relates to a target suitable for use in the radiation-electric translator according to the invention.

The invention furthermore relates to a method of manufacturing a target of the above-mentioned type in which on one side of a semiconductor plate a mosaic of mutually separated regions is formed which regions each form a rectifying junction with the part of a first conductivity type of the semiconductor plate, termed the substrate, adjoining said regions, while via an insulating layer provided on the relative side and having windows at the area of the regions, mutually separated electrically conductive layers are provided which conductive layers are each associated with one of the regions of the mosaic, characterized in that via a network of gaps in the insulating layer, which gaps surround the places for the windows associated with the regions of the mosaic, grooves are etched in the semiconductor material between the regions of the mosaic, in which, due to underetching the insulating layer remains projecting above the edge of the grooves such that the grooves obtain the form of longitudinal hollow spaces, and that in addition the relevant conductive layers are provided on the insulating layer in such manner as to project also above the grooves and, with the exception of the area of the windows, be supported by the insulating layer throughout their lower side. The conductive layers are preferably provided after providing the grooves, for example, by vapour-deposition. Preferred embodiments of the method according to the invention have already been described above and/or will be described hereinafter.

The invention will now be described with reference to the accompanying drawings, in which:

FIG. 1 shows diagrammatically a camera tube having a semiconductor target.

Figure 2:
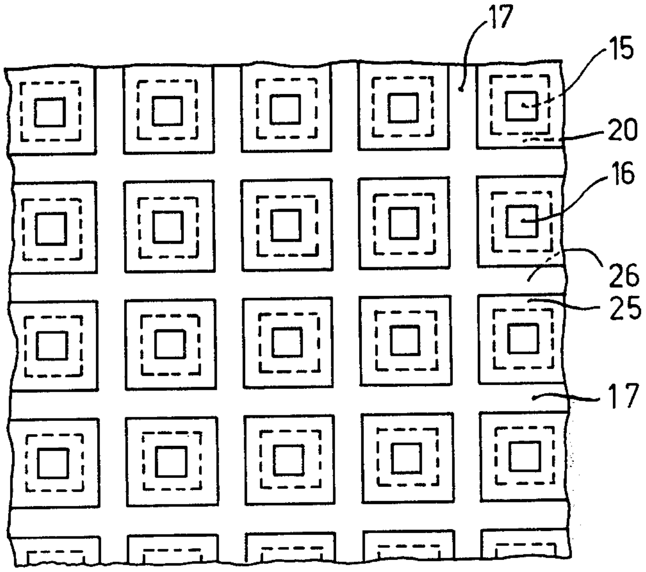
Figure 3:
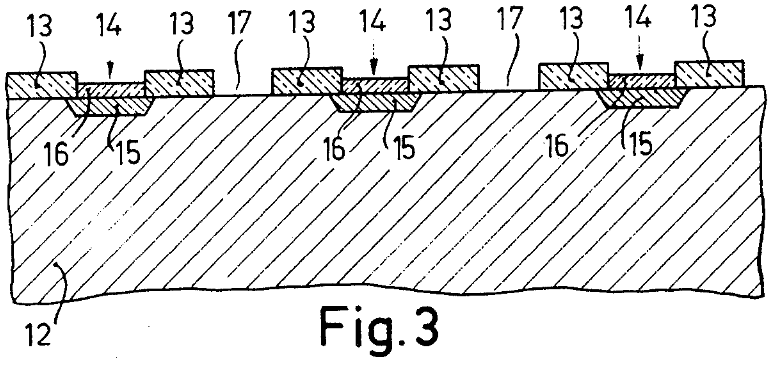
Figure 4:
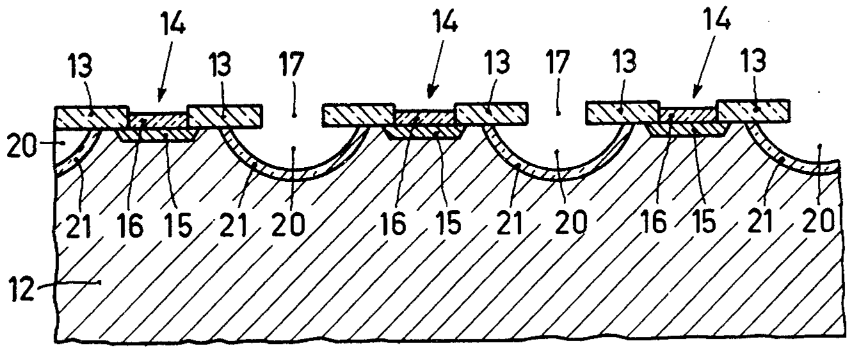
Figure 5:
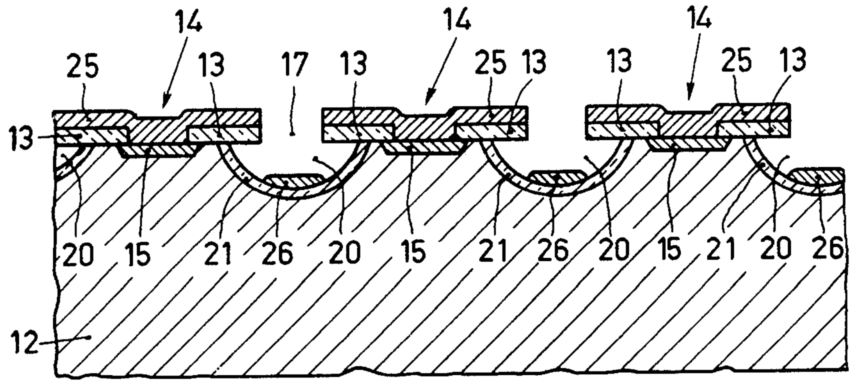

FIGS. 2 and 5 show details of such a target. FIG. 2 shows a detail of an elevation of the scanning side of the target and FIG. 5 shows a detail of a cross-sectional view of said target, FIGS. 3 and 4 are cross-sectional views of details of stages of the manufacture of the target, of which FIGS. 2 and 5 show details, FIGS. 6 and 9 show details of vertical cross-sectional views of successive stages in the manufacture of another embodiment of a target.

Figure 6:
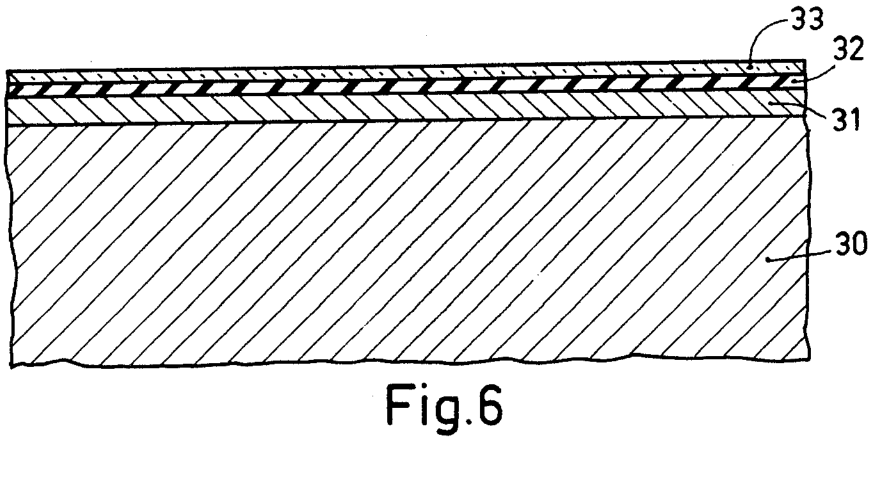
Figure 7:
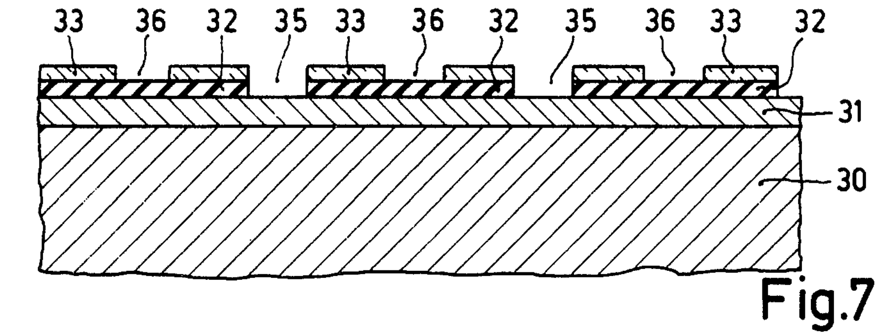
Figure 8:
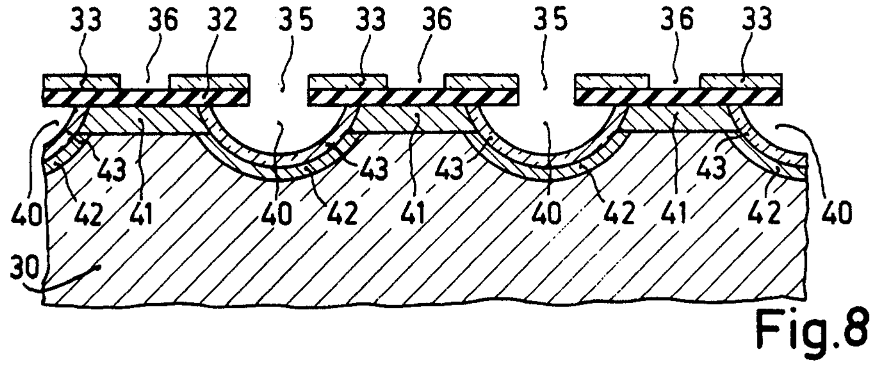
Figure 9:
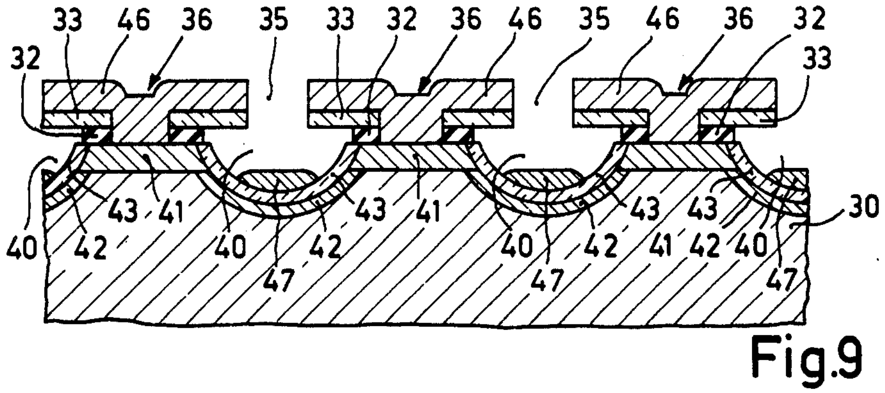

FIGS. 7 and 8 are cross-sectional views of details of stages of the manufacture of the target, of which FIGS. 6 and 9 show details.

The camera tube 1, for example a television camera tube, shown in FIG. 1 comprises an electron source or cathode 2 and a photosensitive target 10 to be scanned by an electron beam emerging from said source 2. The target 10 is formed by a semiconductor plate which, on the side to be scanned by the electron beam, comprises a mosaic of mutually separated regions each forming a rectifying junction with the part of the one conductivity type of the semiconductor plate, termed the substrate, adjoining said regions. The camera tube comprises in the usual manner electrodes 5 for accelerating electrons and for focusing the electron beam. Furthermore conventional means are present to deflect the electron beam so that the target 10 can be scanned. These means consist, for example, of a system of coils 7. The electrode 6 serves to screen the wall of the tube from the electron beam. A scene to be picked up is projected on the target 10 by means of the lens 8, the wall 3 of the tube being pervious to radiation. Furthermore a collector grid 4 is present in normal manner. By means of this grid which, for example, may be an annular electrode, secondary electrons, for example, from the target 10, can be removed.

The target 10 may have a construction as is shown diagrammatically in detail in FIGS. 2 and 5. It is constructed from a monocrystalline semiconductor plate of silicon having an n-type substrate material 12 of a resistivity of 10 ohm.cm and a thickness of approximately 14 to 15 $\mu$, in which on one side a mosaic of p-type zones 15 is provided which zones form rectifying p-n junctions with the substrate. Grooves 20 are provided on the same side of the semiconductor plate between the p-type zones 15. An insulating layer 13 having window 14 at the area of the p-type zones 15, is covered with a mosaic of readily conducting layers 25 which are electrically connected to the p-type zones 15 via the windows 14. In the insulating layer 13 and between the conductive layers 25, gaps 17 are present above the grooves 20 and divide the insulating layer 13 into pieces and also separate the conductive layers 25 from each other. The gaps 17, however, are narrower than the upper side of the grooves 20 so that the insulating parts 13 with the conductive layers 25 provided therein project above the grooves 20. The p-type zones 15 with the associated readily conducting layers 25 form a mosaic of regions, the regions forming rectifying junctions with the substrate material 12.

The side of the target where the mosaic of regions 25, 15 is provided forms the scanning side of the target. During operation, the substrate 12 which consists of n-type silicon is positively biased relative to the cathode 2 of the camera tube. When the scanning electron beam passes a conductive layer 25, the relevant region 25, 15 is charged to substantially cathode potential, the rectifying junction with the substrate being biased in the reverse direction. The relevant region 25, 15 is then fully or partly discharged dependent upon the intensity of the radiation which impinges upon the target in the proximity of the relevant region. When the electron beam again passes the region 25, 15, charge is again supplied until the region has assumed substantially cathode potential. This charging results in a current in the substrate and across the associated output electrode with load. This current is a measure of the intensity of the radiation which has fully or partly discharged the region 25, 15 in one scanning cycle. Since the gap 17 between the conductive layers 25 is comparatively narrow and the bottom of the groove is located much lower than said conductive layers 25, the number of electrons which arrive in the groove 20 via the gap 1 will be none too large. Nevertheless if the said electrons would impinge upon the substrate material in the bottom of the groove, they might produce a stray current with an annoying noise level. Therefore, an insulating coating 21 is preferably provided in the groove 20, at least on the bottom of the groove and preferably also on the side walls of the grooves. In order to prevent a large accumulation of charge on the insulating coating which might have a possibly too large repellent action on the electron beam, a conductive coating 26 is preferably applied on the bottom of the grooves 20 on the insulating coating 21, which coating 26 forms a conductive grid in the network of grooves and which grid causes charge, resulting from electrons of the scanning electron beam having penetrated through the gaps 17 into the groove, to be removed in known manner.

The target may be manufactured as follows: A monocrystalline, n-type silicon plate having a resistivity of 10 ohm.cm is covered on one side with an insulating layer 13 by oxidizing the plate in the usual manner. A mosaic of windows 14 is provided in the silicon oxide layer 13 thus formed, after which boron is diffused in the windows, the p-type zones 15 being formed which form a rectifying p-n junction with the n-type substrate 12. In addition, layers 16 consisting of borosilicate glass are formed in the window 14. A network of gaps 17 is then etched in the insulating layer 13 by means of conventional photographic methods, which gaps divide said layer into rectangular parts which each contain a window 14 which is partly filled with the borosilicate glass. The photographic mask used can easily be aligned on the windows 14, which are clearly observable since the borosilicate layers 16 therein have a smaller thickness than the surrounding oxide layer 13. The gaps can be etched in known manner with a solution of ammonium fluoride and hydrofluoric acid. The resulting stage is shown diagrammatically in detail in FIG. 3.

The grooves 20 are then etched in the semiconductor material, for example with an etchant on the basis of hydrofluoric acid and nitric acid, which does not etch away the oxide layer 13. Due to underetching, the upper side of the resulting grooves is wider than the gaps 17. The plate is then again subjected to an oxidizing thermal treatment to form an oxide coating 21 on the walls of the grooves 20. The resulting stage is shown in FIG. 4.

The target can now be given the desirable thickness by a material-removing treatment, for example etching from the side opposite to the side having the provided p-type zones 15. Phosphorus may then be diffused on the said opposite side in the substrate material. The windows 14 are then opened, for example, in known manner by providing a masking by means of a positive photoresist. A suitable conductor is then provided to form the layers 25 and the grid 26 in the grooves. For example, the metals aluminium and gold have proved to be particularly suitable conductors to this end. If desirable, a thin layer of titanium may previously be provided in the latter case. The provision is preferably carried out by using vapour-deposition in a vacuum. If desirable, the metal, in particular the layers 25, may further be thickened by electroplating, in which the possibility is available of giving the grid 26 a different potential so that the metal in the grooves 20 is further thickened. Polycrystalline silicon may also be used, preferably doped with an acceptor and provided by vapour-deposition in a vacuum.

Due to the vapour-deposition process and the presence of the grooves 20 it is achieved that mutually insulated conductive layers 25 connected to the p-type zones 15 and a conductive grid 26 insulated from said layers and present at the bottom of the grooves are obtained. The gaps 17 being narrower than the upper side of the grooves 20, the metal for the grid 26 will mainly deposit on the bottom of the groove. Should, however, some metal be deposited against the side walls of the groove 20, a danger of shortcircuit with the conductive layers 25 is reduced by the presence of the insulating layer 13 below the conductive layer 25.

The manufacture of a slightly different embodiment of a target will now be described with reference to FIGS. 6 to 9.

Starting material is a monocrystalline semiconductor plate of silicon of, for example, 10 ohm.cm. Boron is in-diffused on one side throughout the surface to form a p-type silicon layer 31 on an n-type substrate 30. The thickness of the layer 31 is, for example, 2 $\mu$. On the surface of the side with the p-type layer 31 a masking layer of silicon nitride 32 is provided in the usual manner in a thickness of 0.2 $\mu$, on which masking layer a silicon oxide layer 33 in a thickness of 0.6 $\mu$ is provided. A detail of the resulting stage is shown in FIG. 6. By means of a known photographic etching method, gaps 35 are provided in the layers 33 and 32 by means of an etching treatment with hydrofluoric acid, succeeded by an etching treatment with orthophosphoric acid. The gaps 35 form a network which divide the layers 32 and 33 into parts of a rectangular shape. Windows 36 are then provided by means of known photoetching methods in the center of the rectangular parts of the silicon oxide layer 33, while using hydrofluoric acid, in which windows, however, the semiconductur surface remains covered with the silicon nitride of the layer 32 for the time being. A detail of the resulting stage is shown in FIG. 7. Grooves 40 are then etched in the semiconductor via the gaps 35, the remaining parts of the layers 32 and 33 serving as masks. Due to under-etching said grooves become wide on the upper side than the gaps 35. The depth of the grooves 40 should be larger than the thickness of the p-type layer 31, for example, from 3 to 5 $\mu$, so that said layer is divided into a mosaic of mutually separated zones 41 which form p-n junctions with the n-type substrate material 30. For etching the grooves a conventional etching liquid on the basis of hydrofluoric acid and nitric acid may be chosen which does not remove the silicon oxide and the silicon nitride.

It is desirable to provide in the groove an insulating coating, in particular a coating which counteracts the surface recombination. In order to prevent the possibility of the formation of shortcircuit connections between adjacent zones 41 via inversion channels induced along the wall of the groove when using such an insulation coating, a channel stopping zone is preferably formed previously in known manner by diffusion of, for example, arsenic in the groove wall. As the result of this, an $n^+$ type zone 42 is formed along the wall of the groove between the zones 41. Since the maximum concentration of the arsenic, which is in the order of $10^{17}$ atoms per ccm, is low relative to the maximum boron concentration in the zones 41, which is at least $10^{18}$ atoms per ccm, the p-n junction will continue to extend up to the walls of the groove. An oxidation treatment, for example in steam, is then carried out in known manner as a result of which the walls of the grooves are coated with an oxide layer 43 as a result of which surface recombination at the area where the p-n junctions between the zones 41 and the substrate 30 reach the walls of the grooves, is reduced. A detail of the resulting stage is shown in FIG. 8.

In this stage the semiconductor plate can be etched to the desirable low thickness from the oppositely located side. The silicon nitride should then be removed from the windows 36 so as to expose the surface of the p-type zones 41 in said windows. For this purpose, a short treatment in orthophosphoric acid may be carried out in the usual manner, the silicon oxide of the layer 33 serving as a mask. In that case the parts of the silicon nitride layer 33 projecting above the grooves 40 will also be removed, but overhanging parts of the silicon oxide layers 33 separated from each other by the gaps 35, are maintained. Conductive layers 46 are then formed by vapour deposition in a vacuum in the windows 36 and on the remaining parts of the layer 33, said layers 46, together with the zones 41, forming a mosaic of regions to be scanned by electron beams and forming rectifying junctions with the substrate 30. A conductive grid 47 which makes no contact with the mutually separated layers 46 will also be formed on the bottoms of the grooves 40 during the vapour deposition in a vacuum. A detail of the resulting target is shown in FIG. 9.

It will be obvious that the invention is not restricted to the examples described and that many variations are possible to those skilled in the art without departing from the scope of the present invention. Variations are also possible as regards the width of the gaps 35 and 17. Said gaps will preferably be chosen to be not too wide, for example, narrower than 5 $\mu$, preferably not wider than 3 $\mu$. With a distance between the center lines between the metal parts of the mosaic of 20 $\mu$, a suitable gap width is 2 $\mu$. The depth of the grooves to be etched preferably is at least 2 $\mu$, for example from 3 to 5 $\mu$, the width being determined by the extent of underetching and the gap width.

Instead of providing a p-n junction by diffusion, a p-n junction may alternatively be provided epitaxially for example, the layer 31 shown in FIG. 6.

It is alternatively possible to deposit in the windows epitaxial semiconductor material (monocrystalline) for example until the windows are filled, after which a metal or polycrystalline silicon may furthermore be provided by vapour-deposition in a vacuum. The semiconductor material provided epitaxially in the windows may form a p-n junction with semiconductor material which has been exposed in the window previously.

The conductive layers may consist of more than one conductive material, for example, more than one metal or alloy.

In particular when the insulating layer is comparatively thick, the windows may be filled previously with a conducting material, for example by electroplating, after which the conductive material is provided on the insulating layer, for example by vapour-deposition.

Targets having substrates of n-type semiconductor material have so far been described by way of example. However, it is alternatively possible, to manufacture targets from p-type material having a mosaic of regions which form a rectifying junction with the substrate but now rectifying in the opposite sense to the targets described above. In that case the tube should be operated so that the secondary electron current from the scanning side of the target to, for example, the collector grid in the tube (see FIG. 1) is stronger than the primary electron current which impinges upon the scanning side of the target.

In principle, other semiconductors may be chosen instead of silicon, for example, germanium, and semiconductors of the type $A^{III}B^{V}$ or of the type $A^{II}B^{VI}$. The use of heterojunctions is also possible, in principle. Photosensitive junctions of such a type are known per se.

We claim:

1. A method of manufacturing a target for a camera tube comprising the steps of covering a surface of a plate of semiconductor material of given conductivity type with a layer of insulating material having windows therein, introducing through said windows a conductivity-determining impurity to form regions of opposite conductivity in said plate, applying electrically conductive layers over the layer of insulating material over each of said regions and through said windows in contact with each of the said regions of opposite conductivity type, and removing the semiconductor material between the regions of the mosaic to form longitudinal hollow grooves with the insulating layer and conductive layer projecting above the edge of each of the grooves.

2. A method as claimed in claim 1, wherein the walls of the grooves are provided with an insulating coating.

3. A method as claimed in claim 1, wherein the conductive layers are provided after forming the grooves.

4. A method as claimed in claim 3, wherein the conductive layers are vapor-deposited in a vacuum, a conductive deposit being also provided on the bottom of the grooves.

5. A method as claimed in claim 1, wherein prior to forming the grooves a layer of silicon nitride and then a layer of silicon oxide are provided.

* * * * *

UNITED STATES PATENT AND TRADEMARK OFFICE

CERTIFICATE OF CORRECTION

PATENT NO. : 3,916,509

DATED : November 4, 1975

INVENTOR(S) : Arthur M.E. Hoeberechts; Else Kooi

It is certified that error appears in the above-identified patent and that said Letters Patent are hereby corrected as shown below:

Claim 1, line 12, delete "of the mosaic".

Signed and Sealed this

*eighth* Day of *June 1976*

[SEAL]

*Attest:*

RUTH C. MASON
*Attesting Officer*

C. MARSHALL DANN
*Commissioner of Patents and Trademarks*